United States Patent
Higuchi et al.

(10) Patent No.: US 10,507,488 B2
(45) Date of Patent: *Dec. 17, 2019

(54) DEPOSITION APPARATUS AND MANUFACTURING PROCESS INCLUDING FILM FORMING STEP BY DEPOSITION APPARATUS

(71) Applicant: NALUX CO., LTD., Osaka-shi, Osaka (JP)

(72) Inventors: Toshiro Higuchi, Tokyo (JP); Hiroshi Ueno, Otsu (JP); Hitoshi Kimura, Osaka (JP)

(73) Assignee: NALUX CO., LTD., Osaka-Shi, Oska (JP)

( * ) Notice: Subject to any disclaimer, the term of this patent is extended or adjusted under 35 U.S.C. 154(b) by 503 days.

This patent is subject to a terminal disclaimer.

(21) Appl. No.: 15/095,325

(22) Filed: Apr. 11, 2016

(65) Prior Publication Data

US 2016/0303607 A1 Oct. 20, 2016

(30) Foreign Application Priority Data

Apr. 16, 2015 (JP) ................................. 2015-084205

(51) Int. Cl.
*B05D 1/00* (2006.01)
*C23C 16/458* (2006.01)
(Continued)

(52) U.S. Cl.
CPC ............... *B05D 1/002* (2013.01); *B05D 1/60* (2013.01); *C23C 14/24* (2013.01); *C23C 14/50* (2013.01);
(Continued)

(58) Field of Classification Search
CPC ........ B05D 1/002; B05D 1/60; C23C 14/505; C23C 14/50; C23C 14/24; C23C 16/4584; C23C 16/458; C23C 16/4583; G02B 1/10
See application file for complete search history.

(56) References Cited

U.S. PATENT DOCUMENTS 3,598,083 A * 8/1971 Dort ...................... C23C 14/505
                                                           118/730
3,635,811 A * 1/1972 Lane ......................... B05D 1/62
                                                          204/192.15
(Continued)

FOREIGN PATENT DOCUMENTS

JP  62-270768 A  11/1987
JP  04-329869 A  11/1992
(Continued)

OTHER PUBLICATIONS

Derwent Abstract 2015-61550A (Year: 2019).*
Office Action dated Jan. 26, 2016 corresponding to Japanese Patent Application No. 2015-084205.

*Primary Examiner* — Jeffrie R Lund
(74) *Attorney, Agent, or Firm* — Squire Patton Boggs (US) LLP

(57) ABSTRACT

A deposition apparatus includes a dome rotatable around the central axis; a loop chain surrounding the central axis on the dome; a power transmission shaft transmitting rotational motion of the dome; a first gear section transforming the rotational motion of the dome to rotational motion of the shaft; a second gear section provided with a chain-driving sprocket and configured to transform the rotational motion of the shaft to rotational motion of the sprocket; and a tray holder located beside the loop chain, the tray holder including a first internal power transmission shaft and a rotating portion holding a tray. The sprocket is rotated through the rotation of the dome to drive the loop chain, the first internal (Continued)

power transmission shaft of the tray holder is rotated by motion of the loop chain, and the rotating portion is rotated through rotation of the first internal power transmission shaft.

4 Claims, 9 Drawing Sheets

(51) Int. Cl.
  *C23C 14/24* (2006.01)
  *C23C 14/50* (2006.01)
  *G02B 1/10* (2015.01)
(52) U.S. Cl.
  CPC ........ *C23C 14/505* (2013.01); *C23C 16/4584* (2013.01); *C23C 16/4583* (2013.01); *G02B 1/10* (2013.01)

(56) References Cited

U.S. PATENT DOCUMENTS

| | | | | |
|---|---|---|---|---|
| 3,783,821 A * | 1/1974 | Dobson | ............... | C23C 14/505 118/730 |
| 3,853,091 A * | 12/1974 | Christensen | .......... | C23C 14/505 118/720 |
| 3,858,547 A * | 1/1975 | Bergfelt | ............... | C23C 14/505 118/730 |
| 4,034,704 A * | 7/1977 | Wossner | ............... | C23C 14/505 118/730 |
| 4,378,189 A * | 3/1983 | Takeshita | ............... | C23C 14/56 118/500 |
| 4,449,478 A * | 5/1984 | Kraus | ................... | C23C 14/505 118/504 |
| 4,583,488 A * | 4/1986 | Brown, Jr. | ............. | C23C 14/505 118/500 |
| 5,074,246 A * | 12/1991 | Gailliard | .............. | C23C 14/505 118/715 |
| 5,133,286 A * | 7/1992 | Choo | ...................... | C23C 14/26 118/725 |
| 5,190,590 A * | 3/1993 | Suzuki | ................. | C23C 14/243 118/664 |
| 6,001,184 A * | 12/1999 | Procureur | ............. | C23C 14/505 118/715 |
| 6,082,298 A * | 7/2000 | Suter | ..................... | C23C 14/505 118/728 |
| 9,861,996 B2 * | 1/2018 | Higuchi | ................ | C23C 14/505 |
| 2003/0180462 A1 * | 9/2003 | Chang | ..................... | C23C 14/30 427/255.28 |
| 2006/0130760 A1 * | 6/2006 | Zultzke | .................. | C23C 14/044 118/719 |
| 2007/0157883 A1 * | 7/2007 | Zultzke | .................. | C23C 14/24 118/715 |
| 2010/0272893 A1 * | 10/2010 | Chang | .................. | C23C 14/044 427/255.5 |
| 2011/0100806 A1 * | 5/2011 | Sugawara | ............. | C23C 14/345 204/298.06 |
| 2013/0095973 A1 * | 4/2013 | Kroneberger | ..... | H01L 21/68785 475/149 |
| 2014/0016139 A1 * | 1/2014 | Sai | ..................... | G01B 11/0625 356/632 |
| 2015/0258561 A1 * | 9/2015 | Higuchi | ................ | C23C 14/505 118/712 |
| 2016/0303607 A1 * | 10/2016 | Higuchi | ................ | C23C 14/505 |

FOREIGN PATENT DOCUMENTS

| | | | |
|---|---|---|---|
| JP | 09-143717 A | | 6/1997 |
| JP | 5793737 | * | 10/2015 |
| JP | 2016-17219 A | * | 2/2016 |

* cited by examiner

DEPOSITION APPARATUS AND MANUFACTURING PROCESS INCLUDING FILM FORMING STEP BY DEPOSITION APPARATUS

BACKGROUND

Field

The present invention relates to a deposition apparatus and a manufacturing process including a film-forming step by a deposition apparatus.

Description of the Related Art

A deposition apparatus is used to form anti-reflection films on surfaces of optical elements such as lenses and diffraction gratings, for example. The deposition apparatus includes a deposition source for supplying a material which is used to form a film, and a dome which covers the deposition source and is rotatable around the central axis. Plural trays are attached to the dome and plural works, for example, lenses or diffraction gratings are attached to each of the trays.

In order to realize uniform deposition amount over each work, deposition apparatuses that is configured such that trays are made to move around the deposition source (movement around the deposition source) and each tray is made to rotate on its own central axis (rotation on its own central axis) have been developed (JPS62-270768A and JPH4-329869A, for example).

However, the mechanisms of the deposition apparatuses described above are not sufficient for reliable rotation of many trays installed on the dome on their own central axes. Further, the movement around the deposition source and the rotation on its own central axis of each tray are not sufficient for reduction of unevenness in deposition amount on respective faces of each work when each work has a three dimensional shape. On the other hand, from the standpoint of manufacturing and maintenance costs, deposition apparatuses should preferably be as simple as possible in structure.

Thus, a deposition apparatus and a manufacturing process including a film-forming step by a deposition apparatus that can ensure reliable rotation of many trays installed on the dome on their own central axes and can reduce unevenness in deposition amount on respective faces of each of works having a three dimensional shape and attached to one of the trays have not been developed.

PATENT DOCUMENTS

Patent document 1: JPS62-270768A
Patent document 2: JPH4-329869A

Accordingly, there is a need for a deposition apparatus and during rotation of the dome that can ensure reliable rotation of many trays installed on the dome on their own central axes and can reduce unevenness in deposition amount on respective faces of each of works having a three dimensional shape and attached to one of the trays.

SUMMARY

A deposition apparatus according to a first aspect of the present invention includes a dome configured to be rotatable around the central axis; a loop chain arranged on the dome, the loop chain surrounding the central axis; a power transmission shaft configured to transmit rotational motion of the dome; a first gear section configured to transform the rotational motion of the dome to rotational motion of the power transmission shaft; a second gear section provided with a chain-driving sprocket and configured to transform the rotational motion of the power transmission shaft to rotational motion of the chain-driving sprocket; and a tray holder located beside the loop chain on the dome, the tray holder including a first internal power transmission shaft and a rotating portion configured to hold a tray. The deposition apparatus is configured such that the chain-driving sprocket is rotated through the rotation of the dome to drive the loop chain, the first internal power transmission shaft of the tray holder is rotated by motion of the loop chain, and the rotating portion is rotated through rotation of the first internal power transmission shaft.

In the deposition apparatus according to the present aspect, the loop chain arranged on the dome is driven through rotation of the dome, and the first internal power transmission shaft of each tray holder located beside the loop chain on the dome is rotated through the loop chain. Thus, in each tray holder located beside the loop chain on the dome, rotation of a tray (rotation on its own central axis) is generated so that unevenness in amount of material deposited on each portion of each work having a three-dimensional shape and attached to the tray can be reduced.

A deposition apparatus according to a first embodiment of the first aspect of the present invention includes plural loop chains and plural power transmission shafts, each of the plural power transmission shafts corresponding to a separate one of the plural loop chains.

In the deposition apparatus according to the present embodiment, many trays held by many tray holders located beside the plural loop chains are rotated (rotation on their own central axes) so that unevenness in amount of material deposited on each portion of works having three-dimensional shapes and attached to the many trays can be reduced.

In a deposition apparatus according to a second embodiment of the first aspect of the present invention, each tray holder is further provided with; a fixing portion fixed on the dome of the deposition apparatus; a swinging portion fixed to a swing pivot held rotatably by the fixing portion so as to be swingable; and a second internal power transmission shaft connected to the first internal power transmission shaft through a universal joint and held rotatably by the swinging portion. The first internal power transmission shaft is held rotatably by the fixing portion, the rotating portion is held by the second internal power transmission shaft and configured to hold a tray, and the rotating portion is configured to rotate with the second internal power transmission shaft and to swing with the swinging portion when the first internal power transmission shaft is rotated by each loop chain.

A tray in the deposition apparatus according to the present embodiment is made to rotate with the rotating portion, and the rotating portion is made to swing with the swinging portion when the first internal power transmission shaft is rotated. Thus, the tray undergoes rotation (rotation on its own central axis) and swing, and therefore unevenness in amount of material deposited on each portion of each work having a three-dimensional shape and attached to the tray can be further reduced.

In a deposition apparatus according to a third embodiment of the first aspect of the present invention, each tray holder is further provided with a crank mechanism including a rotating plate and a crank rod, the rotating plate is configured to be rotated through the rotation of the first internal power transmission shaft, and the crank rod connecting the rotating plate and the swinging portion is configured to swing the swinging portion through the rotation of the first internal power transmission shaft.

In the deposition apparatus according to the present embodiment, the crank mechanism is configured to generate swing of the swinging portion from rotational motion of the first internal power transmission shaft.

In a deposition apparatus according to a fourth embodiment of the first aspect of the present invention, each tray holder is configured such that a distance between the position where the crank rod is connected to the rotating plate and the center of the rotating plate can be changed to change the maximum value of an angle of inclination of a tray face with respect to a reference position.

In the deposition apparatus according to the present embodiment, the maximum value of an angle of inclination of a tray face with respect to the reference position can be easily changed by changing the distance between the position where the crank rod is connected to the rotating plate and the center of the rotating plate.

A manufacturing process according to a second aspect of the present invention includes a film forming step by a deposition apparatus. The deposition apparatus includes: a dome configured to be rotatable around the central axis; a loop chain arranged on the dome, the loop chain surrounding the central axis; and a tray holder located beside the loop chain and configured to transform rotational motion of the dome transmitted though the loop chain to rotational motion around a rotating axis of the tray holder and swinging motion around a swinging axis of the tray holder. In the manufacturing process, a film is formed on a work attached to a tray held by the tray holder through deposition while the rotational motion and the swinging motion in the tray holder are carried out during rotation of the dome.

In the manufacturing process according to the present aspect, the tray undergoes rotation and swing during rotation of the dome, and therefore unevenness in amount of material deposited on each portion of each work having a three-dimensional shape and attached to the tray can be reduced.

DETAILED DESCRIPTION

Figure 1:
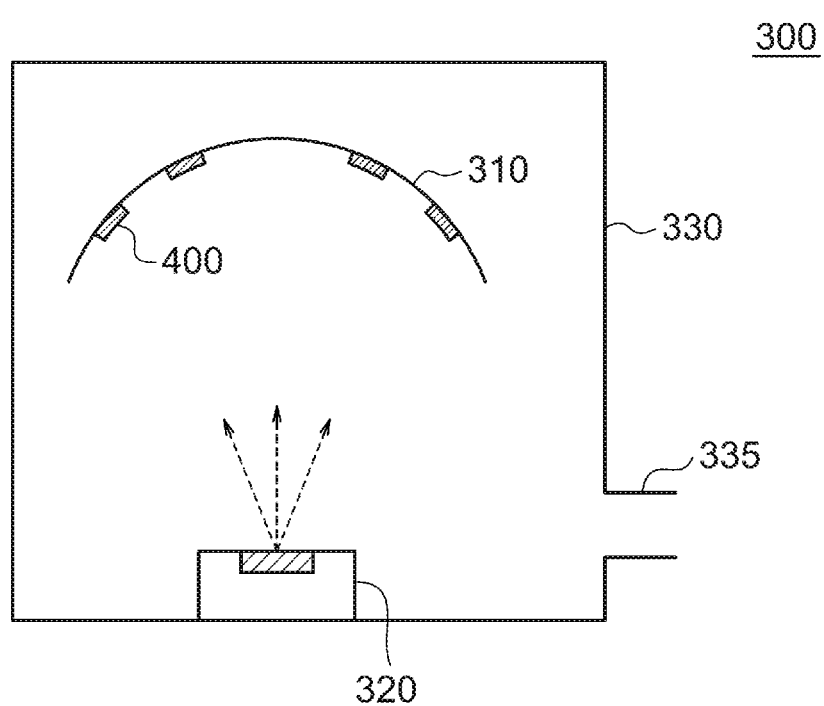
FIG. 1 shows a construction of a deposition apparatus according to the present invention.

FIG. 1 shows a construction of a deposition apparatus 300 according to the present invention. The deposition apparatus 300 includes a deposition source 320, a dome 310 and a chamber 330 which encloses them. The chamber 330 is evacuated using an exhaust hole 335 and a predetermined degree of vacuum is maintained inside it. The dome 310 is configured such that works 400 can be attached to the inner wall of it and is installed such that it covers the deposition source 320. Works 400 are optical element such as diffraction gratings, for example, and are attached to one of trays that are attached to the inner wall of the dome 310 by one of tray holders not shown in the drawing. The trays are not shown in the drawing, either. A material which has been emitted by the deposition source 320 reaches the works 400 attached to the inner wall of the dome 310 and is disposed onto surfaces of the works. During the deposition process the dome 310 is rotated around the central axis by a driving section not shown in the drawing so as to realize uniform deposition amount among the plural works 400 attached to the inner wall of the dome 310. The descriptions given above are commonly applied to the deposition apparatus 300 according to the present invention and conventional deposition apparatuses. The characteristic construction of the deposition apparatus 300 according to the present invention will be described below.

Figure 2:
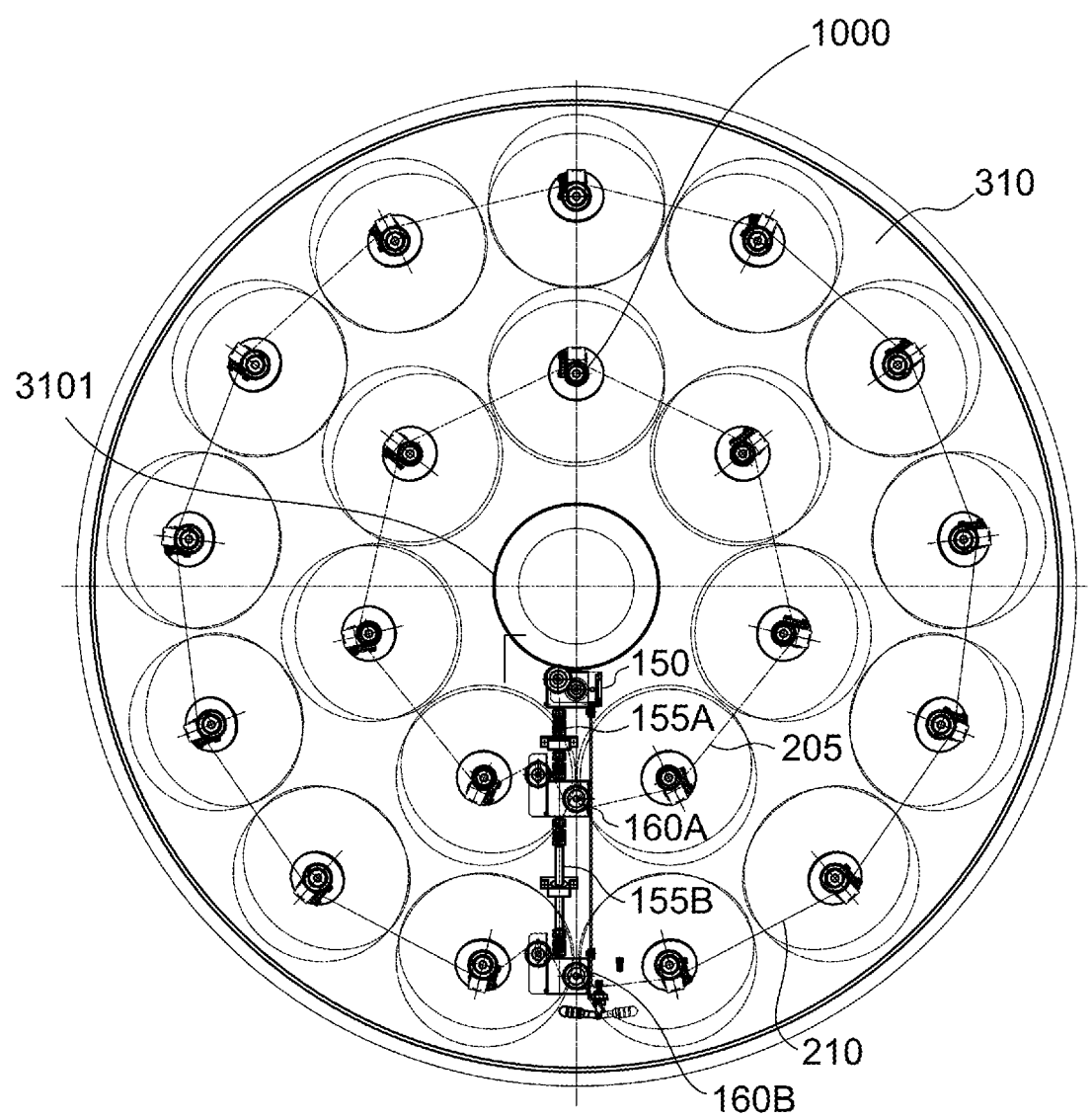
FIG. 2 shows a plan view of the dome of the deposition apparatus 300 according to the present invention.

FIG. 2 shows a plan view of the dome 310 of the deposition apparatus 300 according to the present invention. The deposition apparatus 300 according to the present invention is configured such that trays attached to one of tray holders 1000 are made to rotate by rotation of a portion of the one of the tray holders 1000 installed on the dome 310 and the rotation of the portion of the one of the tray holders 1000 is realized by rotation of the dome 310.

In order to transmit rotational motion of the dome 310 to the tray holders 1000, the deposition apparatus is provided with a first gear section 150, second gear sections 160A and 160B, and rotating shafts for power transmission (power transmission shaft) 155A and 155B. The first gear section 150 is engaged with a fixed gear 3101 attached to a bearing section for a rotating shaft of the dome 310 and generates rotational motion of the rotating shaft for power transmission 155A when the dome 310 rotates. The second gear section 160A transforms the rotational motion of the rotating shaft for power transmission 155A to rotational motion of a sprocket, and the rotational motion of the sprocket drives a loop chain 205. As a result, rotating portions of the plural tray holders 1000 connected to the loop chain 205 are made to rotate. Further, the rotational motion of the rotating shaft for power transmission 155A is transmitted to the rotating shaft for power transmission 155B. The second gear section 160B transforms the rotational motion of the rotating shaft for power transmission 155B to rotational motion of a sprocket, and the rotational motion of the sprocket drives a loop chain 210. As a result, rotating portions of the plural tray holders 1000 connected to the loop chain 210 are made to rotate.

Figure 3:
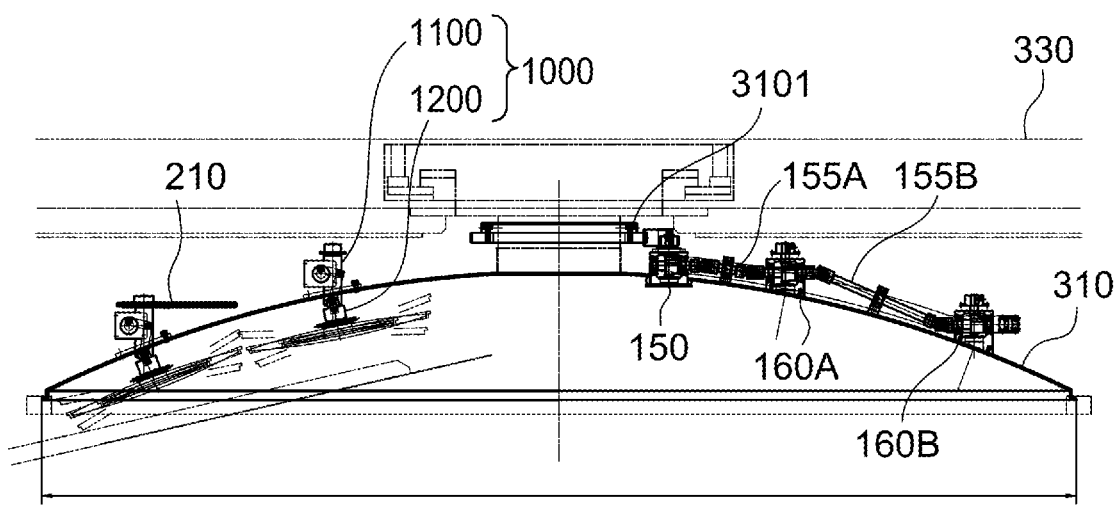
FIG. 3 shows a cross section of the dome of the deposition apparatus according to the present invention.

FIG. 3 shows a cross section of the dome 310 of the deposition apparatus 300 according to the present invention.

The cross section contains the central axis of the dome 310. The dome 310 is hung from the ceiling of the chamber 330 and configured to be rotated around the central axis by a driving mechanism not shown in the drawing. The system may be configured such that the rotational speed of the dome 310 can be adjusted between 10 rpm and 20 rpm, for example. When the dome 310 rotates around the central axis, the rotational motion of the dome 310 makes the first gear section 150 generate rotational motion of the rotating shaft for power transmission 155A as described above. The second gear section 160A generates rotational motion of a sprocket as well as rotational motion of the rotating shaft for power transmission 155B through the rotational motion of the rotating shaft for power transmission 155A. The second gear section 160B transforms the rotational motion of the rotating shaft for power transmission 155B to rotational motion of a sprocket.

Each of the tray holders 1000 includes a fixing portion 1100 and a swinging portion 1200. A rotating portion of the fixing portion 1100 is rotated by the loop chain 205 or 210. The tray holders 1000 will be described later.

Figure 4A:
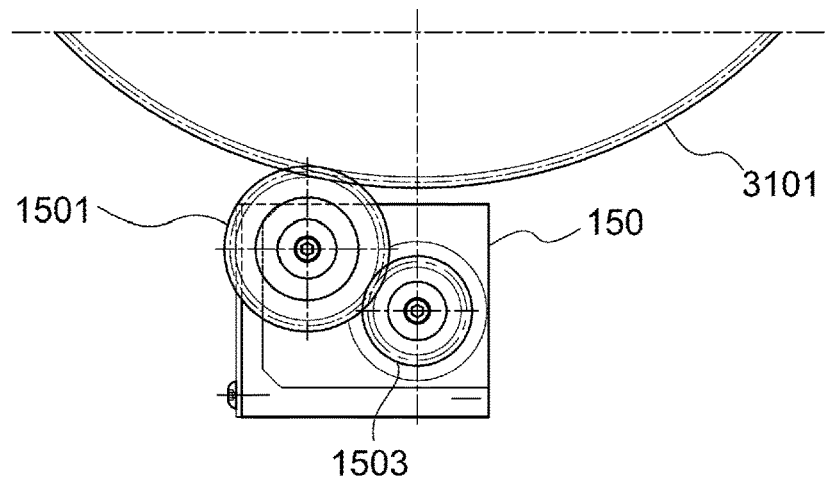
FIG. 4A is a plan view of the first gear section and the gear fixed to the bearing section for the rotating shaft of the dome.
Figure 4B:
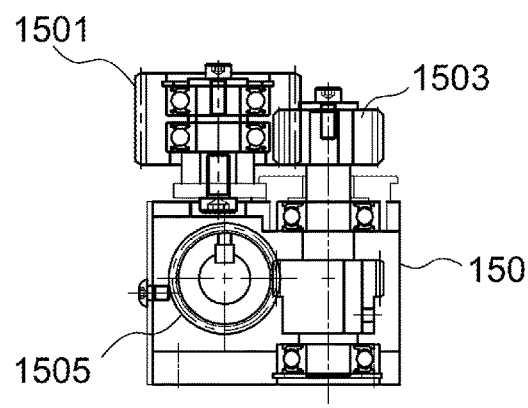
FIG. 4B is a side view of the first gear section.
Figure 4C:
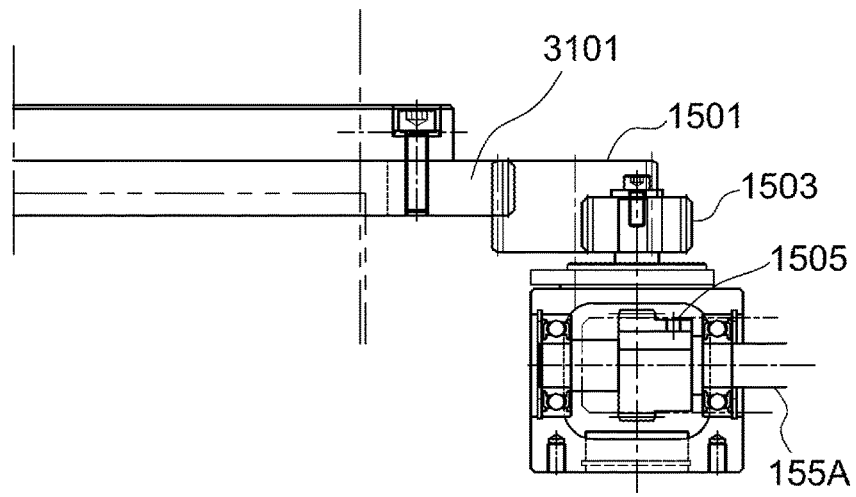
FIG. 4C is a side view of the first gear section and the gear fixed to the bearing section for the rotating shaft of the dome.

FIGS. 4A to 4C illustrate the first gear section 150. FIG. 4A is a plan view of the first gear section 150 and the gear 3101 fixed to the bearing section for the rotating shaft of the dome 310. FIG. 4B is a side view of the first gear section 150. FIG. 4C is a side view of the first gear section 150 and the fixed gear 3101 attached to the bearing section for the rotating shaft of the dome 310. As shown in FIGS. 4A to 4C, an idler gear 1501 of the first gear section 150 is engaged with the fixed gear 3101 attached to the bearing section for the rotating shaft of the dome 310 on the one hand and with a driving gear 1503 of the first gear section 150 on the other. The first gear section 150 is fixed on the dome 310, and therefore the idler gear 1501 engaged with the fixed gear 3101 is rotated when the dome 310 rotates around the central axis. Further, when the idler gear 1501 rotates, the driving gear 1503 engaged with the idler gear 1501 is rotated. The rotational motion of the driving gear 1503 is transformed to rotational motion of the rotating shaft for power transmission 155A through a spiral gear 1505. Thus, the first gear section 150 generates the rotational motion of the rotating shaft for power transmission 155A by the use of the rotational motion of the dome 310.

Figure 5A:
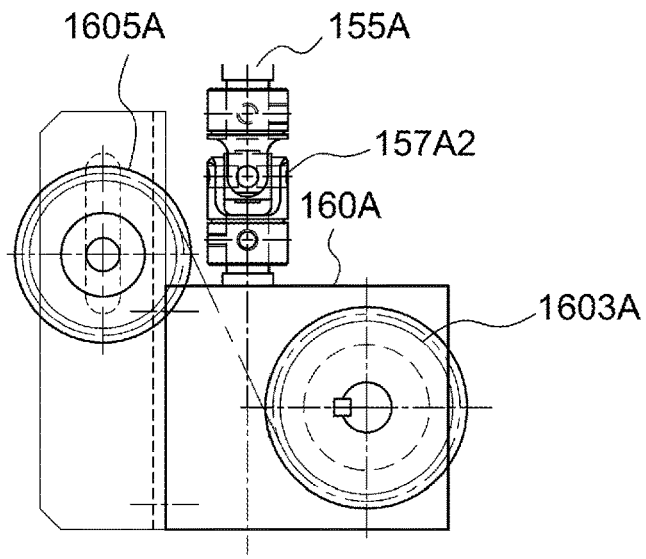
FIG. 5A is a plan view of the second gear section and the rotating shaft for power transmission.
Figure 5B:
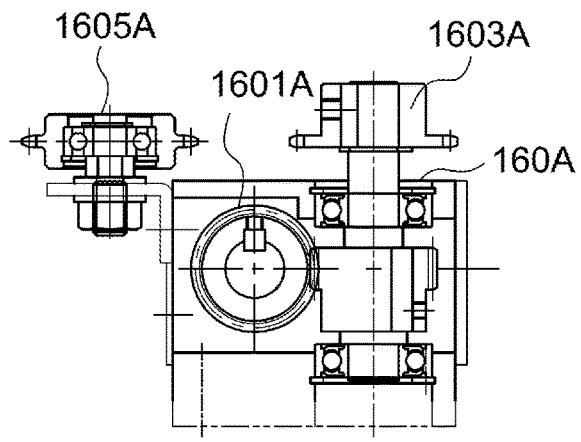
FIG. 5B is a side view of the second gear section.
Figure 5C:
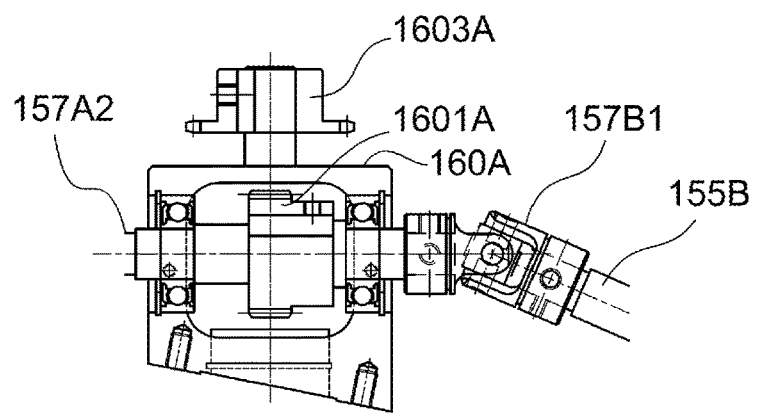
FIG. 5C is a side view of the second gear section and the rotating shaft for power transmission.

FIGS. 5A to 5C illustrate the second gear section 160A FIG. 5A is a plan view of the second gear section 160A and the rotating shaft for power transmission 155A. FIG. 5B is a side view of the second gear section 160A. FIG. 5C is a side view of the second gear section 160A and the rotating shaft for power transmission 155B.

As shown in FIG. 5A, rotational motion of the rotating shaft for power transmission 155A is transmitted to the second gear section 160A through a universal joint 157A2.

As shown in FIGS. 5B and 5C, the rotational motion of the rotating shaft for power transmission 155A transmitted to the second gear section 160A is transformed to rotational motion of a sprocket 1603A through a helical gear 1601A Sprockets 1603A and 1605A are engaged with the loop chain 205 such that the rotational motion of the sprocket 1603A drives the loop chain 205. The reason that the sprocket 1605A is provided in addition to the sprocket 1603A is to enhance engagement between the sprocket 1603A and the loop chain 205. Thus, the second gear section 160A drives the loop chain 205 by the use of the rotational motion of the rotating shaft for power transmission 155A.

As shown in FIG. 5C, the rotational motion of the rotating shaft for power transmission 155A is further transmitted to the rotating shaft for power transmission 155B through the universal joint 157A2 and a universal joint 157B1.

Figure 6A:
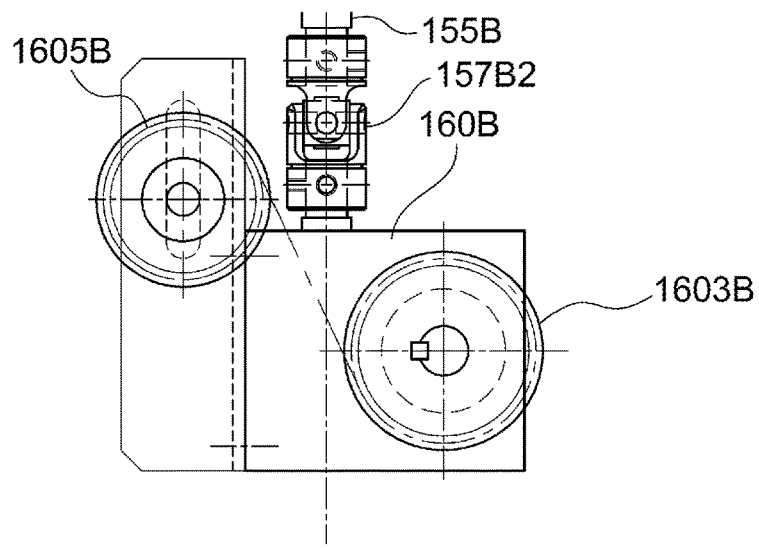
FIG. 6A is a plan view of the second gear section and the rotating shaft for power transmission.
Figure 6B:
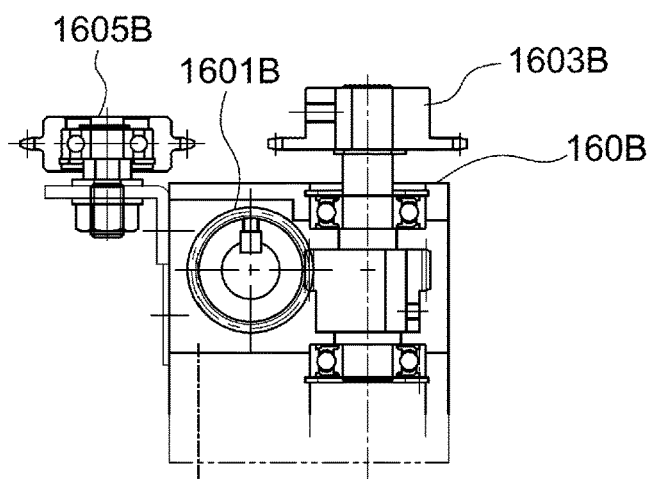
FIG. 6B is a side view of the second gear section.
Figure 6C:
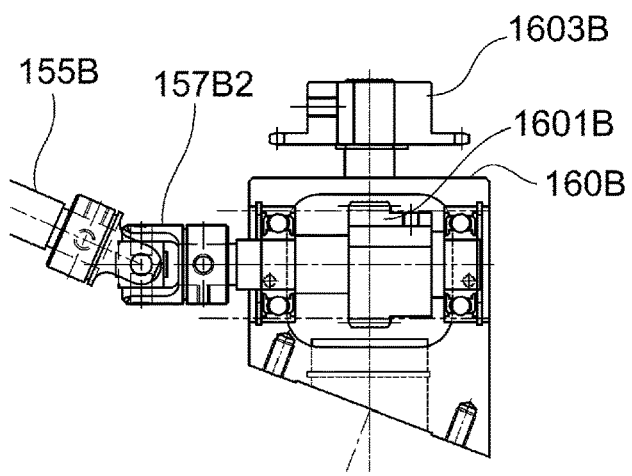
FIG. 6C is a side view of the second gear section and the rotating shaft for power transmission.

FIGS. 6A to 6C illustrate the second gear section 160B. FIG. 6A is a plan view of the second gear section 160B and the rotating shaft for power transmission 155B. FIG. 6B is a side view of the second gear section 160B. FIG. 6C is a side view of the second gear section 160B and the rotating shaft for power transmission 155B.

As shown in FIG. 6A, rotational motion of the rotating shaft for power transmission 155B is transmitted to the second gear section 160B through the universal joint 157B1.

As shown in FIGS. 6B and 6C, the rotational motion of the rotating shaft for power transmission 155B transmitted to the second gear section 160B is transformed to rotational motion of a sprocket 1603B through a helical gear 1601B. Sprockets 1603B and 1605B are engaged with the loop chain 210 such that the rotational motion of the sprocket 1603B drives the loop chain 210. The reason that the sprocket 1605B is provided in addition to the sprocket 1603B is to enhance engagement between the sprocket 1603B and the loop chain 210. Thus, the second gear section 160B generates the rotational motion of the sprocket 1603B by the use of the rotational motion of the rotating shaft for power transmission 155B to drive the loop chain 210.

Figure 7A:
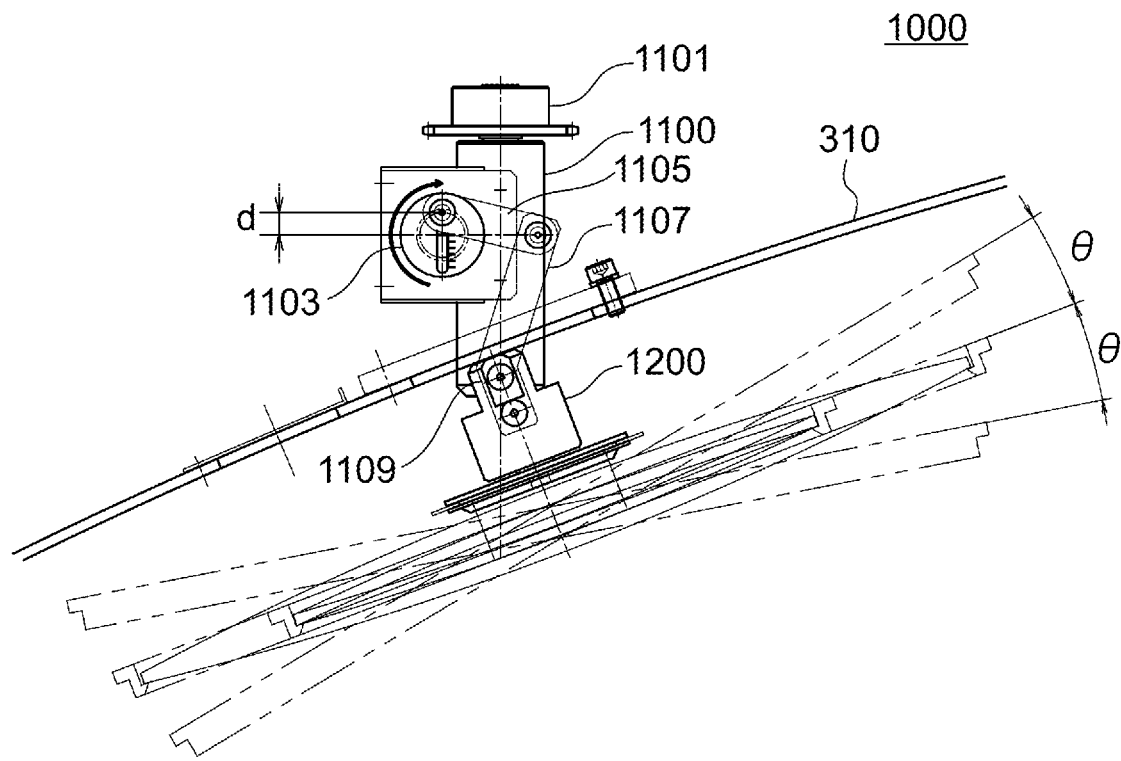
FIG. 7A is a side view of a tray holder installed on the dome.
Figure 7B:
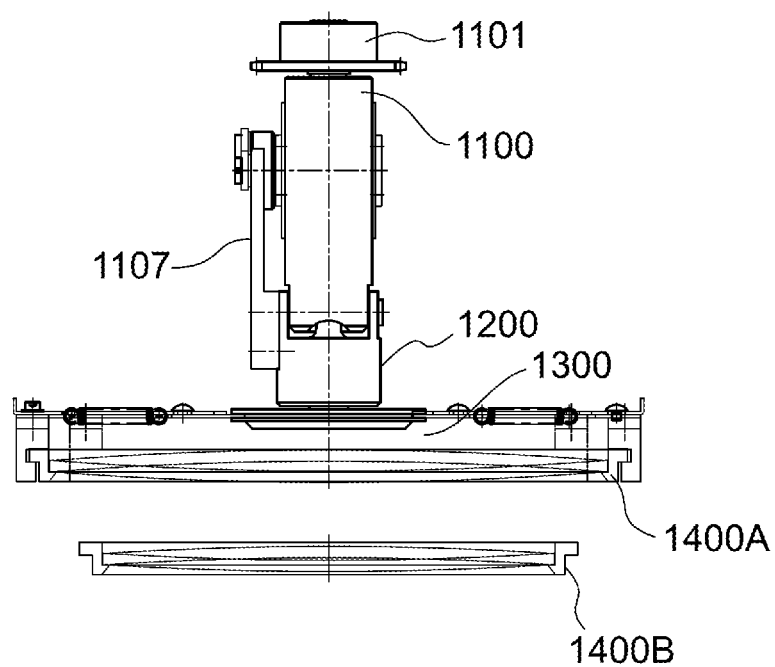
FIG. 7B is another side view of the tray holder.

FIGS. 7A and 7B illustrate each of the tray holders 1000. FIG. 7A is a side view of each tray holder 1000 installed on the dome 310. The side is in the radial direction. FIG. 7B is another side view of the tray holder 1000. The side of FIG. 7B is orthogonal to the side of FIG. 7A. Each of the tray holders 1000 includes the fixing portion 1100, the swinging portion 1200 and the rotating portion 1300. The fixing portion 1100 is fixed on the surface of the dome 310 in such a way that the central axis of the fixing portion 1100 is parallel to the central axis of the dome 310. A swing pivot 1109 of the swinging portion 1200 is attached rotatably to the fixing portion 1100. The swing pivot 1109 may be set orthogonal to the central axis of the fixing portion 1100. Further, the swing pivot 1109 may be set orthogonal to a plane containing the central axis of the dome 310 and the central axis of the tray holder 1000.

The rotating portion 1300 is configured to hold a tray 1400A or a tray 1400B by means of a chuck. The chuck is configured to be adjusted according to size of trays such as the tray 1400A and the tray 1400B which are different in size.

Figure 8A:
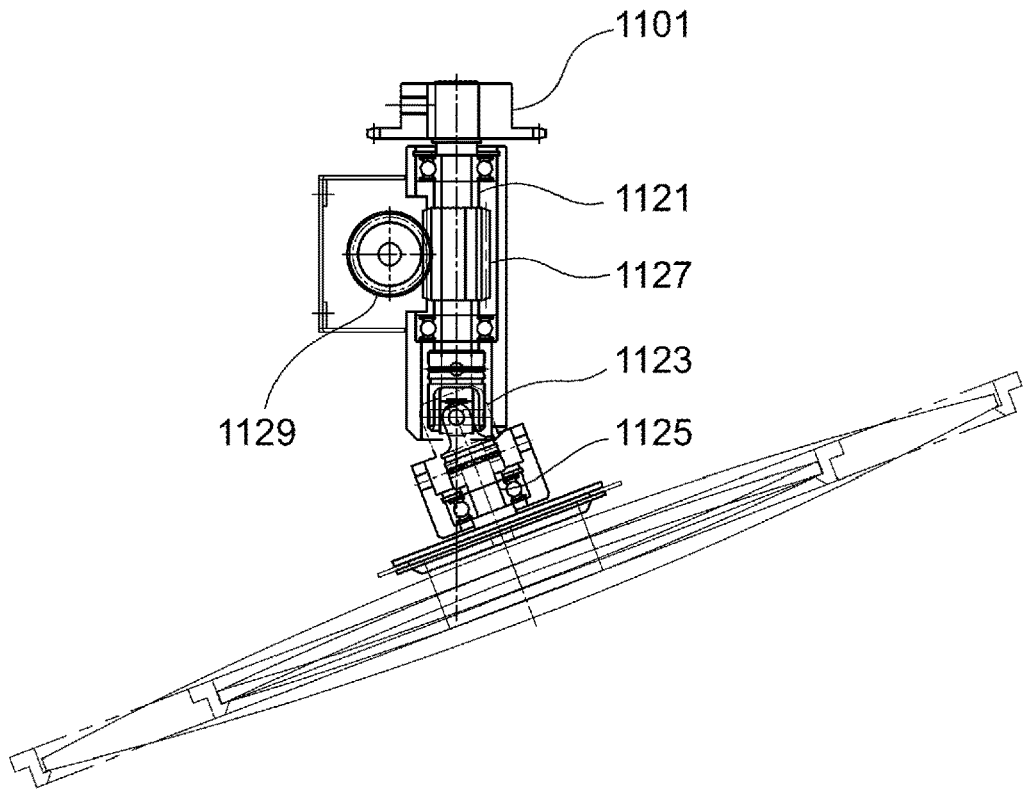
FIGS. 8A and 8B illustrate the internal mechanism of the fixing portion and the swinging portion of each of the tray holders.
Figure 8B:
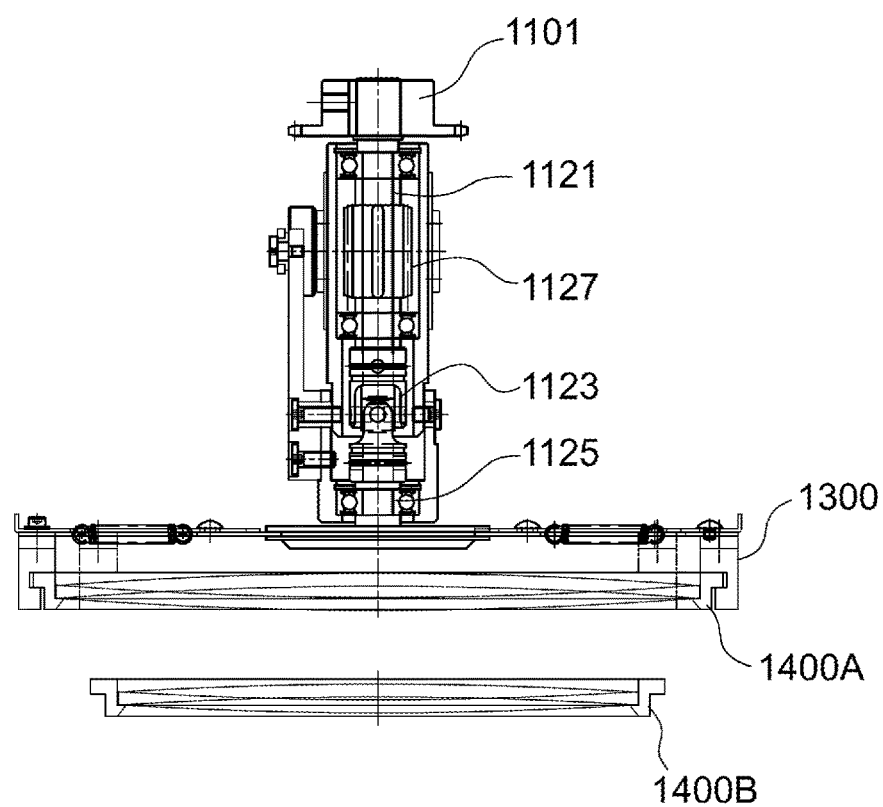

FIGS. 8A and 8B illustrates the internal mechanism of the fixing portion 1100 and the swinging portion 1200 of each of the tray holders 1000. FIG. 8A corresponds to FIG. 7A and FIG. 8B corresponds to FIG. 7B.

Inside the fixing portion 1100, a first rotating shaft (a first internal power transmission shaft) 1121 is provided. A sprocket 1101 is connected to an end of the first rotating shaft 1121 such that the first rotating shaft 1121 is rotated when the sprocket 1101 is rotated by the loop chain 205 or 210. Inside the swinging portion 1200, a second rotating shaft (a second internal power transmission shaft) 1125 is provided. The second rotating shaft 1125 is connected to the other end of the first rotating shaft 1121 through a universal joint 1123 such that the second rotating shaft 1125 is rotated when the first rotating shaft 1121 rotates. The second rotating shaft 1125 is connected to the rotating portion 1300. Accordingly, when the sprocket 1101 is rotated by the loop chain 205 or 210, the first rotating shaft 1121 and the second rotating shaft 1125 are rotated and then the rotating portion 1300 that holds a tray is rotated.

Thus, when the dome 310 rotates and the sprocket 1101 is rotated by one of the loop chains, the rotating portion 1300 that holds a tray is rotated. The gear ratios are determined such that the rpm of the rotating portion 1300 is ten times as high as that of the dome 310, for example.

As shown in FIG. 7A, the fixing portion 1100 is provided with a rotating plate 1103. A first end of a first rod 1105 is connected to the rotating plate 1103 at a position spaced d from the center of the rotating plate 1103. A second end of the first rod 1105 is connected to a first end of a second rod 1107. A second end of the second rod 1107 is connected to the swinging portion 1200. As shown in FIG. 8A, a worm 1127 is attached to the first rotating shaft 1121. The worm 1127 is engaged with a worm wheel 1129, and the rotating plate 1103 is attached to the rotating shaft of the worm wheel 1129. Accordingly, when the first rotating shaft 1121 rotates, the worm 1127 and the worm wheel 1129 are rotated, and then the rotating plate 1103 is rotated. When the rotating plate 1103 rotates, the swinging portion 1200 swings around the swing pivot 1109 by means of the first rod 1105 and the second rod 1107. In a cross section in the radial direction of the dome 310, the maximum value of an angle of inclination of a tray face with respect to the tangential plane of the dome 310 at the position of the central axis of the fixing portion 1100 is referred to as a swing angle. In other words, the swing angle is the maximum value of an angle of inclination of a tray face with respect to the reference position and is the angle represented as θ in FIG. 7A. The swing angle can be changed by changing the distance d between the position at which the first end of the first rod 1105 is connected to the rotating plate 1103 and the center of the rotating plate 1103. The swing angle increases with the distance d. The distance d is determined such that the swing angle is ±10 degrees, for example.

Thus, when the dome 310 rotates and the sprocket 1101 is rotated by the loop chain, the swinging portion 1200 swings. The gear ratios are determined such that a cycle of swing is carried out for a period of revolution of the dome 310, for example.

As described above, the rotating portion 1300 is rotated by means of the second rotating shaft 1125 while the dome 310 rotates. Further, since the second rotating shaft 1125 is held inside the swinging portion 1200, the rotating portion 1300 connected to the second rotating shaft 1125 is made to swing in a similar way when the swinging portion 1200 is made to swing around the swing pivot 1109. Thus, a tray held by the rotating portion 1300 undergoes rotation and swing.

Figure 9:
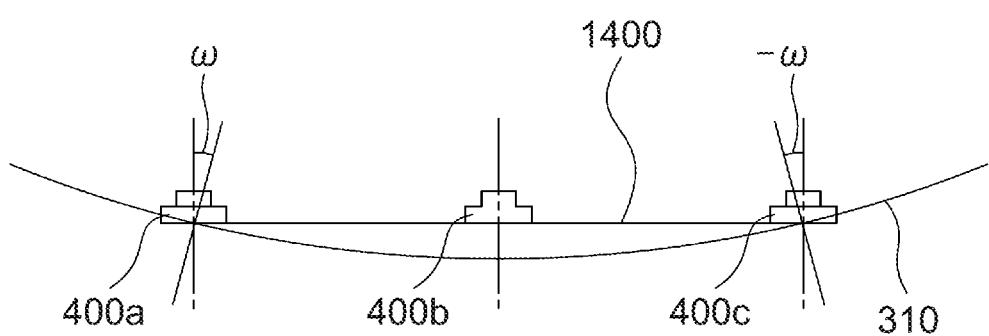
FIG. 9 illustrates how the position of a work on a tray affects an amount of the material deposited on the work by the deposition apparatus.

FIG. 9 illustrates how the position of a work on a tray affects an amount of the material deposited on the work by the deposition apparatus. It is assumed that the tray is fixed to the dome. It is further assumed that the dome 310 is spherical and the deposition source is located at the center of the sphere. In FIG. 9, a work 400a is located on the left side of the tray 1400, a work 400b is located in the center of the tray 1400, and a work 400c is located on the right side of the tray 1400. In this case, the material to be deposited travels along a normal to the inner surface of the dome 310 at the position of each of the works. FIG. 9 shows a cross section that contains the center of the sphere and the normals at the positions of the works. An angle that a normal along which the material to be deposited travels forms with the central axis of each of the works is referred to as a film-forming angle. The central axis of each of the works is perpendicular to the tray 1400 and passes through the center of each of the works. The film-forming angle is measured clockwise with respect to the central axis of each of the works. The central axes are represented as dot-dash lines. In FIG. 9, when the film-forming angle of the work 400a is represented as ω, the film-forming angle of the work 400c is represented as −ω. Further, the film-forming angle of the work 400b is 0. The film-forming angles remain unchanged irrespective of rotational position of the dome 310. As a result, an amount of the material deposited (thickness of a film generated) on the right side of the work 400a is greater than that on the left side of the work 400a. Further, an amount of the material deposited on the left side of the work 400c is greater than that on the right side of the work 400c.

When the tray 1400 is rotated around the central axis of the tray 1400, that is, the central axis of the work 400b, the film-forming angles of the work 400a and the work 400c vary according to the rotation of the tray 1400, and therefore unevenness in amount of the material deposited on each portion of each work is reduced.

Further, by carrying out of swing operation of the tray 1400, unevenness in amount of the material deposited on each portion of each work can be reduced even if works set on the tray 1400 have three-dimensional shapes.

The first ratio of the number of revolutions (rotation on its own central axis) of each tray per unit time to the number of revolutions of the dome per unit time and the second ratio of the number of revolutions of rotating plate 1103 per unit time to the number of revolutions of the dome per unit time can be set to desired values by changing gear ratios. The second ratio determines a period of the swing. Further, as described above, by changing the distance d between the position at which the first end of the first rod 1105 is connected to the rotating plate 1103 and the center of the rotating plate 1103, the swing angle θ can be changed. Thus, the period of rotation of each tray on its own central axis, the period of the swing and the swing angle can be appropriately adjusted according to specifications of works.

What is claimed is:
1. A deposition apparatus comprising:
a dome configured to be rotatable around the central axis;
a loop chain arranged on the dome, the loop chain surrounding the central axis;
a power transmission shaft configured to transmit rotational motion of the dome;
a first gear section configured to transform the rotational motion of the dome to rotational motion of the power transmission shaft;
a second gear section provided with a chain-driving sprocket and configured to transform the rotational motion of the power transmission shaft to rotational motion of the chain-driving sprocket; and
a tray holder located beside the loop chain and fixed on the dome, the tray holder including a first internal power transmission shaft and a rotating portion configured to hold a tray,
wherein the deposition apparatus is configured such that the chain-driving sprocket is rotated through the rotation of the dome to drive the loop chain, the first rotating shaft of the tray holder is rotated by motion of the loop chain, and the rotating portion is rotated through rotation of the first internal power transmission shaft, wherein the tray holder is further provided with
a fixing portion located beside the loop chain and fixed on the dome of the deposition apparatus, the first internal power transmission shaft being held rotatably by the fixing portion;
a swinging portion fixed to a swing pivot held rotatably by the fixing portion so as to be swingable; and a second internal power transmission shaft connected to the first internal power transmission shaft through a universal joint and held rotatably by the swinging portion; and a crank mechanism connecting the first internal power transmission shaft and the swinging portion such that the swinging portion is made to swing by rotation of the first internal power transmission shaft, wherein the first internal power transmission shaft is held rotatably by the fixing portion, the rotating portion is held by the second internal power transmission shaft and configured to hold a tray, and the swinging portion is configured to swing with the rotating portion through rotation of the first internal power transmission shaft, and wherein the deposition apparatus is configured such that the ratio of the number of revolutions of the tray per unit time to the number of revolutions of the dome per unit time and the ratio of the period of the swing to the number of revolutions of the dome per unit time can be set to desired values by changing gear ratios.

2. A deposition apparatus according to claim 1, comprising plural loop chains and plural power transmission shafts, each of the plural power transmission shafts corresponding to a separate one of the plural loop chains.

3. A deposition apparatus according to claim 1, wherein the tray holder is further provided with a crank mechanism including a rotating plate and a crank rod, the rotating plate is configured to be rotated through the rotation of the first internal power transmission shaft, and the crank rod connecting the rotating plate and the swinging portion is configured to swing the swinging portion through the rotation of the first internal power transmission shaft.

4. A deposition apparatus according to claim 3, wherein the tray holder is configured such that a distance between the position where the crank rod is connected to the rotating plate and the center of the rotating plate can be changed to change the maximum value of an angle of inclination of a tray face with respect to a reference position.

* * * * *